United States Patent
Bolander et al.

(10) Patent No.: US 10,474,772 B2
(45) Date of Patent: Nov. 12, 2019

(54) METHOD AND SYSTEM FOR PREDICTING SURFACE CONTACT FATIGUE LIFE

(75) Inventors: Nathan Bolander, Idaho Falls, ID (US); Rajasekhar V. Pulikollu, Nashville, TN (US); Behrooz Jalalahmadi, Idaho Falls, ID (US)

(73) Assignee: Sentient Science Corporation, Buffalo, NY (US)

(*) Notice: Subject to any disclaimer, the term of this patent is extended or adjusted under 35 U.S.C. 154(b) by 0 days.

(21) Appl. No.: 13/617,405

(22) Filed: Sep. 14, 2012

(65) Prior Publication Data

US 2015/0254382 A1    Sep. 10, 2015

Related U.S. Application Data

(60) Provisional application No. 61/535,526, filed on Sep. 16, 2011, provisional application No. 61/536,237, filed on Sep. 19, 2011.

(51) Int. Cl.

| | |
|---|---|
| *G06F 17/50* | (2006.01) |
| *G06F 17/18* | (2006.01) |
| *G01M 13/022* | (2019.01) |
| *F16H 57/00* | (2012.01) |

(52) U.S. Cl.
CPC ....... *G06F 17/5018* (2013.01); *G01M 13/022* (2013.01); *G06F 17/18* (2013.01); *F16H 2057/0087* (2013.01)

(58) Field of Classification Search
CPC ............ G06F 17/5009; G06F 17/5018; G06F 2217/10; G06F 2217/76; G06F 2217/80; G06F 17/18; G01N 2203/0073; G01N 2203/0214; G01N 3/32; G01N 2203/0016; G01N 2203/0066; G01N 2203/006; G01M 13/022; F16H 2057/0087
USPC .............................................. 702/34; 73/804
See application file for complete search history.

(56) References Cited

U.S. PATENT DOCUMENTS

| | | | | |
|---|---|---|---|---|
| 5,952,587 | A | * | 9/1999 | Rhodes et al. ........... 73/862.541 |
| 6,301,970 | B1 | | 10/2001 | Biggs et al. |
| 6,666,790 | B2 | * | 12/2003 | Misada ........................... 476/41 |
| 6,814,495 | B2 | * | 11/2004 | Toda et al. .................... 384/544 |
| 7,024,344 | B1 | | 4/2006 | Nishi |

(Continued)

OTHER PUBLICATIONS

Raje, Nihar, et al., "A Statistical Damage Mechanics Model for Subsurface Initiated Spalling in Rolling Contacts," Journal of Tribology, vol. 130, pp. 042201-1-042201-11, Oct. 2008.

(Continued)

*Primary Examiner* — Alexander Satanovsky
(74) *Attorney, Agent, or Firm* — Waller Lansden Dortch & Davis, LLP; Ira C. Waddey, Jr.

(57) ABSTRACT

A system and method for determining surface contact fatigue life may use a finite element method to determine when components, such as a power transmission component, may fail in operation. The method may generate a finite element model based on the material parameters related to a power transmission component, generate a surface pressure time history for a loading event based on one or more loading parameters, determine, based on the surface pressure time history for a loading event, a finite element solution that describes stress in the grain structure, calculate damage in the finite element solution using a damage model, and determine whether a damage threshold is exceeded.

15 Claims, 8 Drawing Sheets

(56) References Cited

U.S. PATENT DOCUMENTS

| | | | |
|---|---|---|---|
| 8,210,052 B1* | 7/2012 | Biggs | 73/826 |
| 8,280,699 B2* | 10/2012 | Ichishima et al. | 703/1 |
| 8,290,753 B2* | 10/2012 | Tryon et al. | 703/2 |
| 8,302,754 B2* | 11/2012 | Yagi et al. | 192/66.2 |
| 2003/0082836 A1 | 5/2003 | Fetterman et al. | |
| 2004/0201585 A1 | 10/2004 | Srivastava et al. | |
| 2009/0187353 A1* | 7/2009 | Sakai et al. | 702/35 |
| 2009/0240646 A1 | 9/2009 | Tryon, III | |
| 2009/0254286 A1* | 10/2009 | Tulyani et al. | 702/34 |
| 2010/0317477 A1 | 12/2010 | Sheridan et al. | |

OTHER PUBLICATIONS

Jalalahmadi, Behrooz, et al., "A Voronoi FE Fatigue Damage Model for Life Scatter in Rolling Contacts," Journal of Tribology, vol. 132, pp. 021404-1 021404-14, Apr. 2010.

Warhadpande, A., et al., "Effects of Surface Defects on Rolling Contact Fatigue of Heavily Loaded Lubricated Contacts," Proc. IMechE, Part J: J. Engineering Tribology, Oct. 1, 2010 vol. 224 No. 10, pp. 1061-1077.

Slack, Trevor, et al., "Cohesive Zone Modeling of Intergranular Fatigue Damage in Rolling Contacts," Tribology International, vol. 44, pp. 797-804, Jul. 2011.

International Search Report issued for PCT International Application No. PCT/US12/55347, dated Nov. 30, 2012.

\* cited by examiner

METHOD AND SYSTEM FOR PREDICTING SURFACE CONTACT FATIGUE LIFE

RELATED APPLICATION DATA

The present application claims benefit of prior provisional application No. 61/535,526, filed on Sep. 16, 2011, and entitled "METHOD AND SYSTEM FOR PREDICTING SURFACE CONTACT FATIGUE", and prior application 61/536,237, filed on Sep. 19, 2011, and entitled, "METHOD AND SYSTEM FOR PREDICTING SURFACE CONTACT FATIGUE LIFE", both of which are incorporated by reference herein in their entirety.

GOVERNMENT INTEREST STATEMENT

This invention was made in whole or in part with government support under contract number N68335-09-C-0201 with the United States Navy, contract number NNX10CC12P with the National Aeronautics and Space Administration (NASA), and contract number W911W6-06-C-0023 with the United States Army. The government may have certain rights in the invention.

FIELD OF THE INVENTION

The present invention is related to surface contact fatigue life of a power transmission component.

BACKGROUND

Surface contact fatigue may contribute and be the dominant cause of power transmission component failure over time. Contact fatigue differs from classic structural fatigue because it may result from a contact or Hertzian stress state. This localized stress state results when curved surfaces are in contact under a normal load. Subsurface plastic strain may build up with increasing cycles until a crack is generated. The crack may then propagate until a pit is formed. Once surface pitting has initiated, the bearing becomes noisy and rough running. If allowed to continue, fracture of the rolling element and failure occurs. Prediction of surface contact fatigue leading to failure may be expensive and time-consuming due to heavy experimentation that may be required.

SUMMARY

A method and system for determining surface contact fatigue life may use a finite element method to determine when a mechanical component such as a power transmission component may fail in operation. The method may generate a finite element model based on the material parameters related to a power transmission component, generate a surface pressure time history for a loading event based on one or more loading parameters, determine, based on, for example, the surface pressure time history for a loading event, a finite element solution that describes stress in the grain structure, calculate damage in the finite element solution using a damage model, and determine whether a damage threshold is exceeded.

BRIEF DESCRIPTION OF THE DRAWINGS

The subject matter regarded as the invention is particularly pointed out and distinctly claimed in the concluding portion of the specification and appendix. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. It will however be understood by those skilled in the art that the present invention may be practiced without these specific details. In other instances, well-known methods, procedures, and components have not been described in detail so as not to obscure the present invention.

Unless specifically stated otherwise, as apparent from the following discussions, it is appreciated that throughout the specification discussions utilizing terms such as "processing," "computing," "storing," "determining," "evaluating," "calculating," "measuring," "providing," "transferring," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention may include a system and method for predicting the surface fatigue life of mechanical components such as power transmission components. Surface contact fatigue may be a process by which the active, load transmitting contact surfaces in power transmission components such as bearings, gears, and/or other components degrade over time. Components such as bearings, gears, and/or other components may, for example, degrade over time due to the formation of microscopic cracks, which grow under continued usage. When used herein, power transmission components may generally transmit mechanical power, or perform in mechanical machines or engines, for example. Such mechanical machines may be, for example, wind turbines generating electricity, electrical generating equipment, or other machines.

Embodiments of the present invention may provide accurate, physics-based prediction of surface fatigue life distributions for machine components and/or other components subject to contact loading. Machine or power transmission components may, for example, include bearings, gears, and other components, which may be used in condition based maintenance systems and/or other systems. Embodiments of the present invention may, for example, provide a tool for designers to evaluate the performance of components under a variety of scenarios (e.g., with varying materials, manufacturing processes, lubricants, operating conditions) without having to resort to expensive, time consuming testing or other methods.

Embodiments of the present invention may use a physics-based approach in conducting surface fatigue analysis. Physics-based may, for example, mean that it simulates the actual physical processes involved rather than relying on statistical analysis of test data, which may or may not exist. If test data does not exist, expensive and time-consuming physical experiments may be required to determine a proper data set. Embodiments of the present invention may allow for combination, aggregation, and/or simulation of a wide variety of input parameters without the assumption of linearity in parameter dependencies, damage accumulation, or other factors. This may, for example, be made possible by examining the stresses driving the surface fatigue process at a level of detail sufficient to include the primary sources of statistical uncertainty (e.g., microstructure topology and composition, surface roughness, and other factors or properties).

Embodiments of the present invention may consider certain aspects of the surface fatigue process, the unique combination of which may allow for a more accurate and flexible prediction of component surface fatigue life. Explicit calculation or determination of lubrication conditions (e.g., mixed-elastohydrodynamic lubrication and other conditions) may provide a detailed solution for surface pressures, tractions, and other loads (e.g., asperity interaction, asperity contact) placed upon machine components. Embodiments of the present invention may simulate or allow for simulation of the random microstructure topology and composition in steels (e.g., polycrystalline high strength steels other steels), composites, and/or other metals based on measured material characteristics and parameter distributions. Embodiments of the present invention, may provide, calculate, or determine a finite element solution (e.g., a high fidelity finite element solution), numerical solution, and/or analytical solution describing stress in the microstructure, including, for example, contact stresses (e.g., highly localized near-surface contact stresses due to asperity interaction). Embodiments of the present invention may predict, calculate, or determine the location and number of load cycles until crack nucleation and/or initiation in the grain structure (e.g., the grain structure of a material or test specimen). Embodiments of the present invention, may predict crack network evolution through short crack growth, coalescence, on through to failure, including possible self arrest, or transition to long crack growth regime. Other benefits may be realized from embodiments of the present invention.

Figure 1:
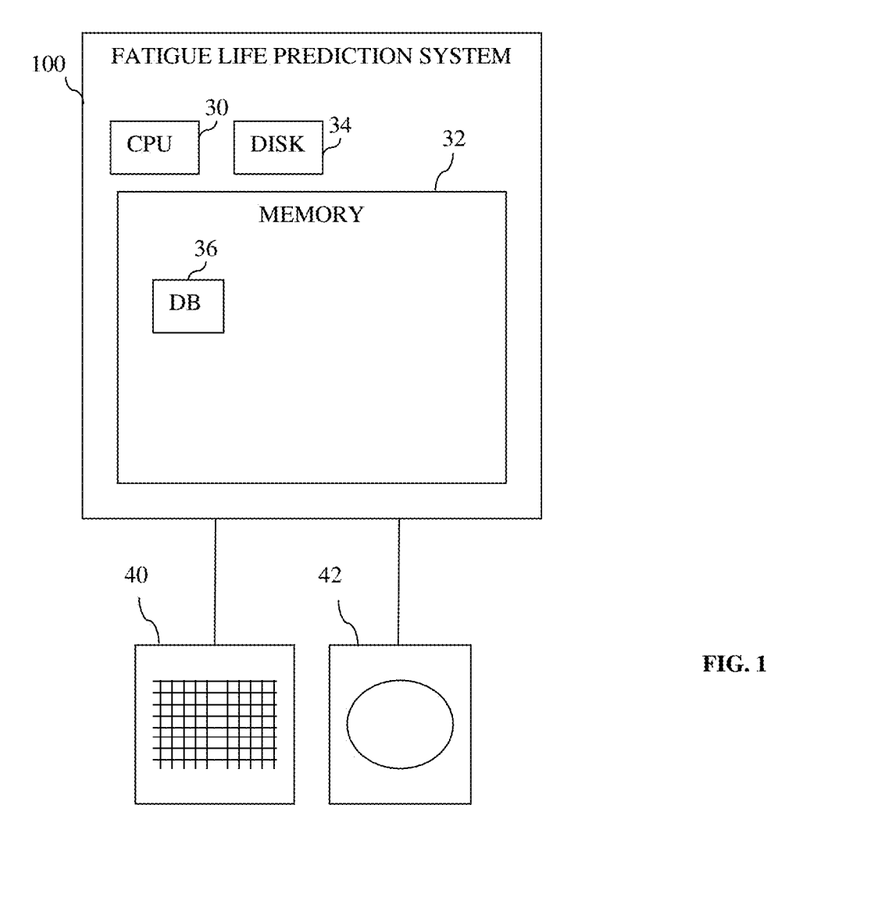
FIG. 1 is schematic diagram of a surface contact fatigue prediction system according to embodiments of the present invention.

FIG. 1 is a schematic diagram of a surface contact fatigue prediction system according to embodiments of the present invention. Surface contact fatigue prediction system 100 (e.g., fatigue prediction system, fatigue life prediction system, surface contact fatigue life prediction system, etc.) may include one or more processor(s) or controller(s) 30, memory 32, long term storage 34, input device(s) or area(s) 40, and output device(s) or area(s) 42. Input device(s) or area(s) 40 and output device(s) or area(s) 42 may be combined into, for example, a touch screen display and input which may be part of system 100. System 100 may be for example a personal computer, workstation, server, or other computing device.

System 100 may include one or more databases 36. Memory 32 or databases 36 may store or include, for example, material specimen information, material properties or parameter information (e.g., physical properties information, mechanical properties information, thermal properties information, manufacturing properties, chemical properties and other properties), material specimen images (e.g., output from a optical microscope, scanning electron microscope, or other microscope), material property constants, and/or other information. Databases 36 may be stored all or partly in one or both of memory 32, long term storage 34, or another device.

Processor or controller 30 may be, for example, a central processing unit (CPU), a chip or any suitable computing or computational device. Processor or controller 30 may include multiple processors, and may include general-purpose processors and/or dedicated processors such as graphics processing chips. Processor 30 may execute code or instructions, for example, stored in memory 32 or long-term storage 34, to carry out embodiments of the present invention.

Memory 32 may be or may include, for example, a Random Access Memory (RAM), a read only memory (ROM), a Dynamic RAM (DRAM), a Synchronous DRAM (SD-RAM), a double data rate (DDR) memory chip, a Flash memory, a volatile memory, a non-volatile memory, a cache memory, a buffer, a short term memory unit, a long term memory unit, or other suitable memory units or storage units. Memory 32 may be or may include multiple memory units.

Long term storage 34 may be or may include, for example, a hard disk drive, a floppy disk drive, a Compact Disk (CD) drive, a CD-Recordable (CD-R) drive, a universal serial bus (USB) device or other suitable removable and/or fixed storage unit, and may include multiple or a combination of such units.

Figure 2:
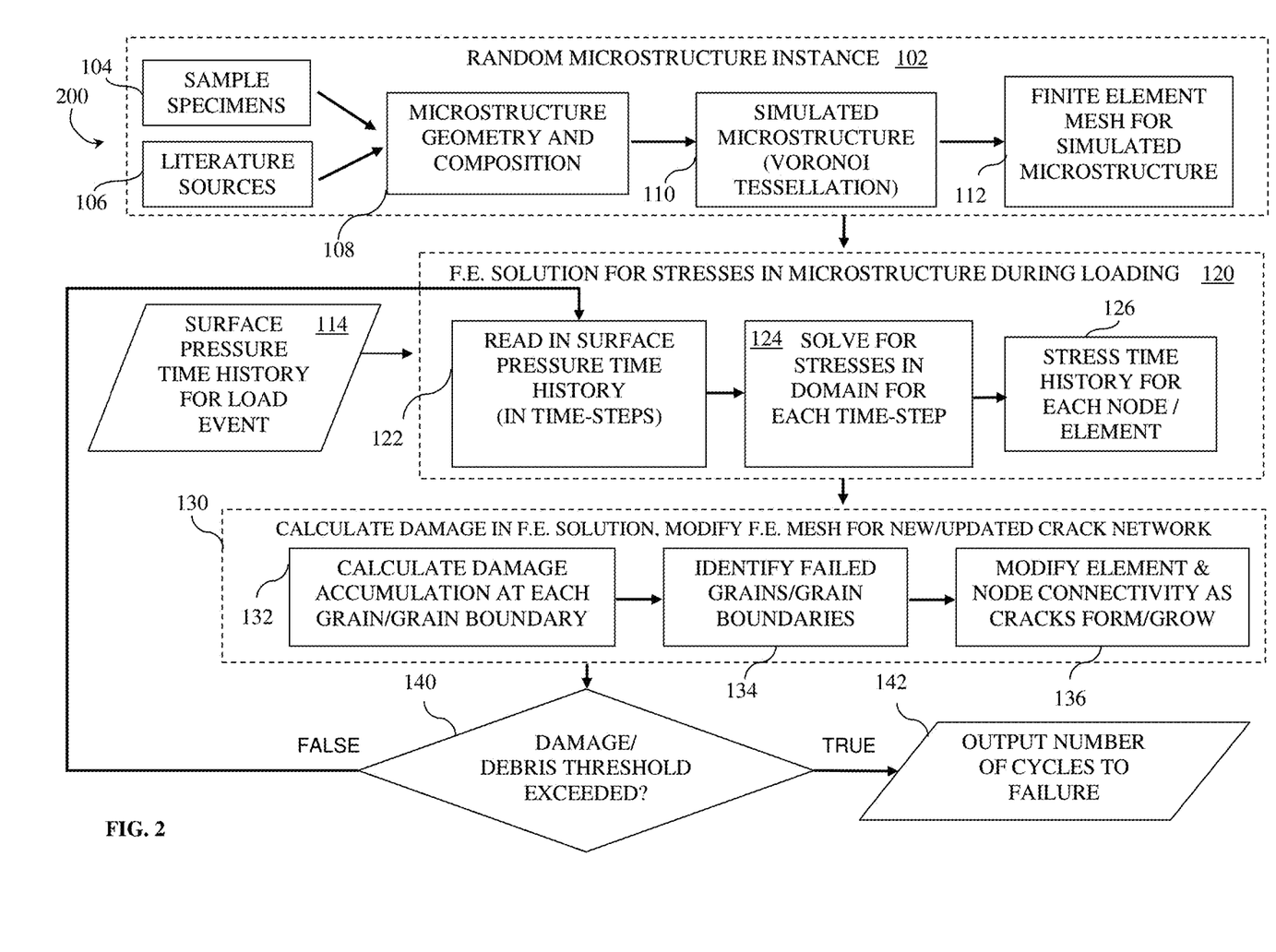
FIG. 2 is a flow chart of a method or process according to embodiments of the present invention.

FIG. 2 is a flow chart of a method 200 or process for simulating surface fatigue life of a mechanical component or object such as a power transmission component, according to embodiments of the present invention. System 100 (FIG. 1) may, for example, calculate or determine stresses using a finite element method or other method 200. While FIG. 2 is described in reference to system 100, other computer systems may be used. Finite element method 200 may, for example, be a numerical technique which may be used to determine the response of a volume of material to an applied loading situation subject to constitutive or connective relationships and boundary conditions. The material volume may, for example, be discretized by a complex system of points or nodes that define discrete elements. By defining basis functions for each element and utilizing a constitutive or connective relationship to define the elastic/plastic behavior of the material, finite element method 200 may use and/or generate a system of algebraic equations for a finite element model, which may be solved using conjugant gradient or other methods.

A random microstructure instance 102 may, for example, be calculated, created or generated. The random microstructure instance 102 may serve as a finite element model describing or modeling the grain structure of a power transmission component. A finite element model may be a group or series of discrete equations or data points that are related to each other. The finite element model describing the material grain structure of the power transmission component may represent the component's polycrystalline properties. A series or group of equations may represent the way that grain boundaries interact with each other. The finite element model may be based on material properties of the power transmission component. Information pertaining to the material (e.g., material specimen) of interest, out of which a component is made, may be gathered, downloaded and or input to a system, such as system 100 for example. The material may have crystalline or polycrystalline characteristics, for example.

In some embodiments, information pertaining to the material of interest may be gathered by a person through either physical examination via optical microscopy and/or scanning electron microscopy of sample specimens 104 obtained from the component of interest or via a survey of published material properties found in the open literature 106 or through some combination thereof. Information may, for example, be a gathered by user through physical examination of a specimen 104 (e.g., obtained from the gear, bearing or other component of interest) using, for example, a microscope (e.g., an optical microscope, electron microscope, scanning electron microscope), physical inspection (e.g., visual, tactile, etc.), or other type of inspection. Data or information relating to the component of interest (e.g., gear, bearing, or other component) may, for example, be obtained or gathered from published material properties, e.g., found in the open literature 106 (e.g., journals, textbooks, publications, etc.), electronic databases, or other sources. Data describing the statistical distributions of both the geometric features and physical composition 108 of the microstructure may, for example, be assembled, combined, or aggregated by a person, system 100, or processor associated with system 100 (e.g., processor 30) into one or more data files. The one or more data files may, for example, be used throughout the simulation process. A memory or other storage device such as memory 32 may store these material properties.

Utilizing information such as size, composition, and other distributions, an instance of a random polygonal (e.g., polyhedral or other shape) crystalline structure may, for example, be generated by system 100 (e.g., by processor 30) using a Voronoi tessellation 110 or other process. The Voronoi tessellation process may, for example, include filling the domain of interest with randomly placed nucleation points or seed points, consistent with microstructure geometric information gathered in operation 108. Nucleation points may be localized areas within a crystal or crystalline material that exhibit a distinct thermodynamic phase. The nucleation points may create the grain structure of the power transmission component. Different materials may have different nucleation characteristics and grain structure due to the atomic structure or manufacture of the materials. For example, the number of nucleation points per volume in a material may depend on the crystallization process used, the solute concentration or suspension density of the crystal solute used in the material. The randomly placed nucleation points may, for example, simulate or represent the geometric or other information input to system 100. Regions may, for example, be constructed or generated around each nucleation point such that all points enclosed by the region are closer to that particular nucleation point than any other nucleation point in the domain. The resulting regions may be convex polygons (e.g., polyhedra or other shapes) each, for example, representing an individual grain in the microstructure. Random distribution of the seed points may, for example, give rise to topological randomness in the microstructure. System 100 may, in some embodiments, store the description of the Voronoi tesselation in database (e.g., in a data file), which may, for example, include Cartesian coordinates for each nucleation point, Cartesian coordinates for each corner (e.g., vertex) of the polygons (e.g., polyhedra), and/or a list of vertices associated with each seed point. A table, hash table, map, or other data structure may include nodes that represent these vertices and nucleation points, and may also describe the relation or connectivity between each node.

According to some embodiments, the Voronoi tessellation, now representing or simulating the microstructure (e.g., grain microstructure) of the material specimen (e.g., steel material present in high strength steels or other materials), may serve as the finite element model, or may be further discretized or meshed into a finite element mesh 112 by system 100 using triangular, tetrahedral or other shaped elements. The finite element mesh 112 may also be based on the material properties of the power transmission component. The resulting meshed domain may be an instance of a random microstructure 102 representative volume. System 100 may, for example, store the description of the mesh in a data file (e.g., stored in memory 32, database 34, etc.) containing Cartesian coordinates of the nodes and connectivity information to define the triangular or tetrahedral elements from the nodes.

According to some embodiments, a finite element solution 120 describing or modeling stresses in the microstructure or grain structure may be determined for each load event or loading cycle simulated onto the finite element model, e.g., random microstructure instance 102. Stresses in the finite element solution 120 may, for example, be calculated or determined in response to an externally calculated surface pressure time history 114 which may be read or input 122 into system 100. Surface pressure time history 114 may, for example, describe the loading boundary conditions describing a single load event in time steps. Surface pressure may include surface traction and bulk load exerted on the power transmission component during a load event. A load event or loading cycle may represent a moment or time period where the power transmission component is operational or functioning in a machine or engine. For example, if a power transmission component is a gear, a load event may represent one meshing cycle, or may be a discrete time period. In another example, if a power transmission component is a ball bearing, a load event may represent one revolution experienced in a ball bearing machine. Other time periods or events may be represented for different types of power transmission components. Surface traction may be the frictional forces exerted on a component's surface due to surface roughness, as the component interacts with other components in a machine. Bulk load may be the external load forces experienced by the component as other components apply pressure to the component. For example, as a gear is meshed and rotated with another gear, the gear may experience surface traction as the gear teeth contact the other gear's teeth. The gear may also experience bulk load as the other gear pushes on the gear to rotate. Surface pressure may include other types of forces and loads acting on the component.

According to some embodiments, the surface pressure time history 114 may, for example, be calculated, for example via a separate process. Each load event may be divided into discrete or separate time periods or episodes. The surface pressure time history 114 may represent the loads or pressures exerted on the component at each time period or episode. The surface pressure time history 114 may, for example, be the output of a surface pressure analysis. Surface pressure analysis may, for example, predict, determine or define loads (e.g., stresses, shear stresses, pressures, etc.) acting on a surface of a component (e.g., specimen material), an area of contact (e.g., between component and another component and/or material), and other parameters. Surface pressure time history 114 may, for example, represent a traction load event applied to a component (e.g., power transmission component, material specimen, etc.) when component contacts another material and/or component. Surface pressure time history 114 may, for example, be determined or calculated based on one or more loading parameters. Loading parameters may, for example, be related to the geometry, physical properties of the power transmission component, operating conditions (e.g., environmental conditions, etc.), lubricant properties (e.g., gear lubricants, bearing lubricants, or other lubricants between components and other material(s)), component surface finish, and/or other loading parameters. Loading values, factors or parameters may, for example, include a surface roughness profile, lubricant properties, surface velocities, curvatures, transmitted load, and other parameters.

In some embodiments, loading parameters may, for example, include surface velocities. Surface velocities may, for example, be or may represent the relative velocity of multiple components (e.g., component and other material or component(s) which come into contact with component) during traction loading. Loading parameters may, in some embodiments, include curvatures, which may be or may represent the surface geometry of the power transmission component (e.g., material specimen). Loading parameters may, for example, include transmitted load. Transmitted load may, for example, be or may represent the load (e.g., force, pressure, etc.) applied to the power transmission component (e.g., material specimen).

The surface pressure time history 114 may be determined or calculated based on one or more loading parameters using numerical methods or other mathematical approach(es). In a surface traction analysis, loading parameters (e.g., surface roughness profile, lubricant properties, etc.) may, for example, be used to explicitly calculate or determine a detailed solution for pressure and shear stress acting on the surface (e.g., surface of power transmission component) and area of contact due to load supported by both lubrication (e.g., a lubrication fluid film) and direct material contact (e.g., asperity contact).

According to some embodiments, by calculating or determining a surface pressure time history 114 unique to a material specimen (e.g., a specimen representing a power transmission component or other component), individual surface models for different types of components may be generated. For example, loading parameters (e.g., surface roughness profile, lubricant properties, surface velocities, curvatures, transmitted loads and other parameters) may be determined based on the specific component (e.g., bearing, gear or other component) to be analyzed or evaluated. A unique surface traction time history based on the loading parameters may, for example, be generated allowing system 100 to be effectively and easily applied to many different types of components (e.g., gears, bearings and other components).

Surface pressure time history 114, which may include bulk loading time history and surface traction time history may, for example, be calculated a-priori (e.g., using processor 30), typically utilizing results from a macro-level finite element model of the component. Surface traction time history and bulk loading time history may, in some embodiments, be used by system 100 to determine or define boundary conditions. Boundary conditions may be assigned by system 100 (e.g., based on surface traction history, bulk loading time history, and/or other parameters) to constrain nodal degrees of freedom on the boundaries of the representative volume domain. The boundary conditions may also limit the effect that some nodes of the microstructure instance 102 may have on other nodes.

According to some embodiments, once stresses acting on the microstructure or grain structure during a loading event have been determined or modeled through a finite element solution 120, the stresses may, for example, be used to determine or calculate damage or a damage level or amount, e.g., how much and where damage initiates in the microstructure 130. A damage model may be used, e.g., a relationship between the state of stress/strain acting on each grain and/or grain boundary in the microstructure may, for example, be used to determine the incremental damage induced by the loading cycle or event. The damage relationship or model may take several forms depending on material data available for the analysis and/or the specific characteristics of the material at the microscopic level. Damage relationship or model may, in some embodiments, be, be based on, or be derived from a continuum damage mechanics (CDM) model, Fatemi-Socie model, dislocation model (e.g., the dislocation model of Tanaka and Mura) or other type of model. In one embodiment the damage relationship or model may be a multiple iterative procedure derived from a dislocation model (e.g., the dislocation model of Tanaka and Mura). In high strength bearing and gear steels the grain boundaries are often found to be the preferential site for crack initiation (e.g., intergranular cracking). A similar procedure may be followed for cased on transgranular cracking. According to some embodiments, total deformation energy required for micro-crack initiation is calculated for all segments along the grain boundary of every grain. Deformation energy may be the energy required to change the size or shape of a grain boundary. For example, in operation 132, deformation energy $U_s^{th}$ to initiate a crack on a particular segment of a grain may determined using an equation such as:

$$U_s^{th} = \frac{4W_s}{d_s} \qquad \text{Eq. 1}$$

where $W_s$ may be the specific fracture energy per unit area and $d_s$ may be the length of the segment (e.g., representative of a grain boundary or other type of segment).

According to some embodiments, in operation 132, deformation energy accumulated per cycle for each segment may be determined using an equation such as:

$$\Delta U_s = \frac{(1-\upsilon)(\Delta \tau_s - 2k)^2}{G} \quad \text{Eq. 2}$$

Where G is the shear modulus, υ may be Poisson's ratio, k may be frictional stress, $\Delta \tau_s$ be may be the average shear stress range. The following table provides an example of other parameters which may be included in the calculation of deformation energy (different specific types of parameters and different specific numbers may be used):

TABLE 1

Material Parameters and Description

| Material Parameter | Carburized AMS 6265 | Description |
|---|---|---|
| Shear modulus, G | 81 GPa | Deterministic parameter<br>Easy to obtain from open literature or measure using tensile test data |
| Poisson's ratio, υ | 0.29 | Deterministic parameter<br>Easy to obtain from open literature |
| Grain size, d | 22 μm, (ASTM 8) | Fatigue cracks tend to initiate at larger grains<br>Probabilistic parameter (lognormal distribution)<br>Estimated based on microstructure analysis |
| Shear stress range, $\Delta \tau_s$ | Micro-stress | Stress evaluated at the grain level, varies due to the anisotropic behavior of the material<br>Fatigue cracks initiate at grains having higher microstress |
| Frictional stress, k | 3-parameter Weibull:<br>Slope: 4.0<br>Scale: 0.14 GPa<br>Loc: 0.10 GPa | Material resistance to the dislocation movement<br>Fatigue cracks tend to initiate at grains having lower frictional stress<br>Probabilistic parameter (Weibull distribution)<br>Estimated based on yield strength of the material |
| Specific fracture energy, $W_s$ | 3-parameter Weibull:<br>Slope: 4.0<br>Scale: 175 kN/m<br>Loc: 100 kN/m | Plastic strain energy a grain may accumulate before micro-cracking<br>The higher the $W_s$, the higher the crack initiation life<br>Probabilistic parameter (Weibull distribution) |

According to some embodiments, in operation 134, damage may be incremented for each grain/grain boundary, allowing calculation and output (for example, to a user, via output device 42) of the number of loading cycles required for failure. Number of cycles $N_s^i$ required to initiate a crack on each segment may be calculated using an equation such as:

$$N_s^i = \frac{U_s^{th} - U_s^i}{\Delta U_s} \quad \text{Eq. 3}$$

Where $U_s^i$ may be the already accumulated damage in each segment of stage i.

According to some embodiments, in operation 134 grains and grain boundaries that are calculated to have reached or exceeded the predefined critical damage threshold earliest (or for which calculated damage exceeds or meets the threshold) may be identified. Cracks may be created on the grain segment with the smallest $N_s^i$ (e.g., $N_{S,Min}^i$). For other segments the accumulated damage for next stage $U_s^{i+1}$ may be increased according to an equation such as:

$$U_s^{i+1} = U_s^i + \Delta U_s \cdot N_{S,Min}^i \quad \text{Eq. 4}$$

According to some embodiments, in operation 136, failure of a grain or grain boundary corresponds to the formation of microcracks which are simulated by modifying or updating 136 the finite element model or mesh 112 to reflect for example the damages inflicted by surface pressures 114 and stresses. The finite element 112 mesh may be modified or updated through for example the nodal release technique, wherein nodes are added to the domain with corresponding changes in element definitions. The changed element definitions may redefine the way that the nodes are connected to each other. Once accumulated damage may be calculated or determined, by using Eq. 4 for example, the method may determine whether a damage or failure threshold is met or exceeded by the calculated damage. The failure criteria may be defined in many ways, for example, the liberation of some quantity of debris particles from the active surface or based on the number of microcracks initiated in the grain, or other criteria.

If a damage threshold is not met or exceeded, the modified finite element mesh 136 may then be used to reevaluate the stresses in the microstructure through another loading cycle or event, since the presence of microcrack(s) may change the stress field in the grain structure by introducing discontinuities and stress risers. In some embodiments, if the threshold is not met or exceeded, steps or operations such as 120, 122, 124, 126, 130, 132, 134, and 136 may be repeated. Microcracks that have initiated in the grain structure are free to join/coalesce and grow in response to the applied surface tractions under successive loading cycles. This process of stress evaluation 120, followed by damage accumulation and mesh modification 130, is continued until a predefined failure threshold 140 is reached. Once the damage and/or debris level meets or exceeds the threshold, the method may output 142 the number of load cycles or events run by the method. The number of load cycles or events may be output to a monitor (42 in FIG. 1, for example) that is read by a user, or the number of load cycles may be output to a memory (32 in FIG. 1). The number of load cycles required to reach or exceed this threshold may be calculated as the sum of $N_{S,Min}^i$ for all stages, and is recorded as the component surface fatigue life.

$$N_i = \sum_{i=1}^{n} N_{S,Min}^i \quad \text{Eq. 5}$$

Embodiments of the method for surface contact fatigue described herein are suitable for applications such as rolling contact fatigue and fretting fatigue that are manifest in a wide variety of ways depending on the severity of the contact stress and tangential shear. Further, the embodiments can be extended to predict the initiation and short crack growth phases of more traditional bending fatigue (e.g. gear tooth bending) with no additional effort.

Figure 3:
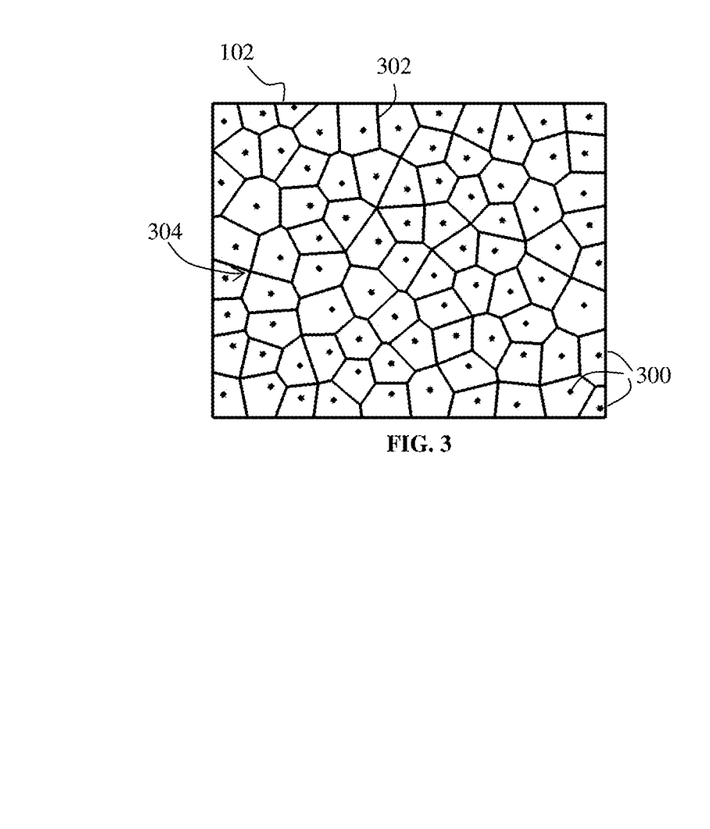
FIG. 3 is an example of a random microstructure instance generated using a Voronoi tessellation, according to embodiments of the present invention.

FIG. 3 is an example of a random microstructure instance 102 (see FIG. 2) generated using a Voronoi tessellation, according to embodiments of the invention. Nucleation points 300 may be randomly determined according to the atomic structure or manufacture of the component or object (e.g. a power transmission component). For example, the density of nucleation points 300 may be determined based on the material properties of the component, and a Voronoi tessellation may create a random distribution of points while maintaining the proper density of nucleation points 300. Based on the nucleation points 300, grain boundaries 302 may be determined. Grain boundaries 302 may define the grain structure for any crystalline or polycrystalline material. The boundaries 302 may surround a region of steady thermodynamic phase change. The grain of each region may differ in orientation and the grain boundaries may separate each grain. For a Voronoi tessellation, the boundaries 302 may be the midpoint between any two nucleation points 300. For other tessellations, other kinds of boundaries may be generated. Intersections between grain boundaries 304 may be represented by nodes in a data structure describing the random microstructure instance or finite element model. The nodes 304 may be related to other nodes, depending on whether a grain boundary 302 is shared between nodes 304.

Figure 4:
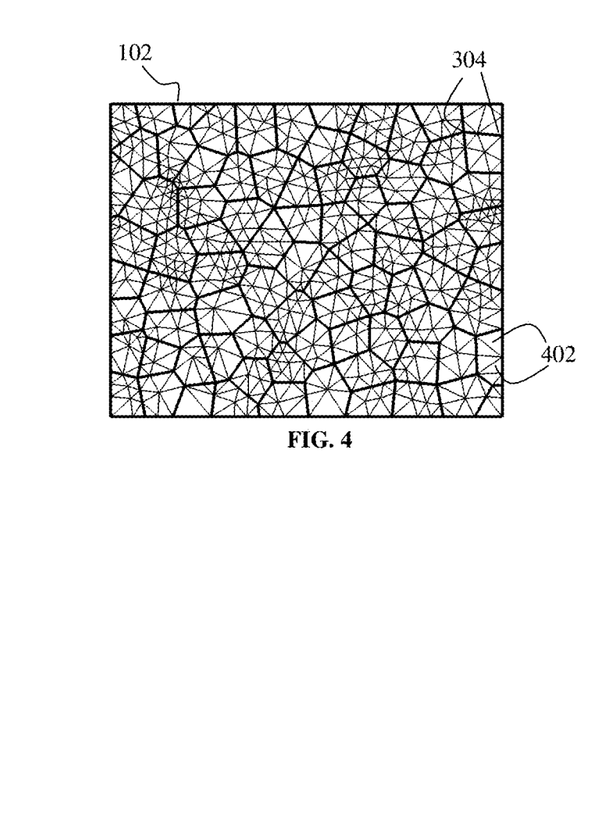
FIG. 4 is an example of a random microstructure instance generated using Voronoi tessellation and meshed with a triangular element, according to embodiments of the present invention.

FIG. 4 is an example of a random microstructure instance 102 generated using Voronoi tessellation and meshed with a triangular element. The random microstructure instance may be generated using a Voronoi tessellation, and may be further discretized into smaller finite elements 402 to provide a finite element model, for example. The finite elements 402 may be triangular, as shown, or may be another convex polygon, such as a rhombus or trapezoid. Avoiding the geometric centroid in the triangular elements may increase accuracy in a finite element solution. Boundary intersections 304 may be represented as nodes in a data structure, and the relationship between nodes may reflect the smaller finite elements 402 in the mesh. In both FIGS. 3 and 4, algebraic equations may also describe the elastic or plastic forces present between nodes.

Figure 5:
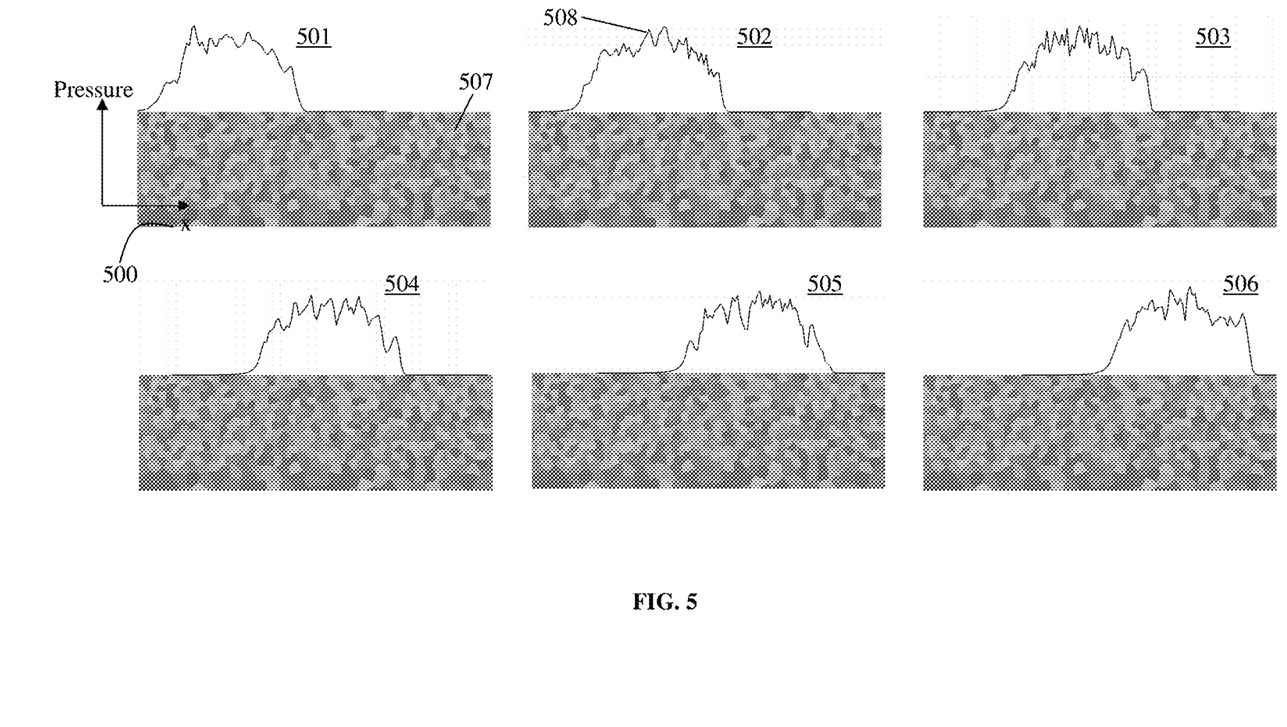
FIG. 5 is a diagram of a surface pressure time history, according to embodiments of the invention.

FIG. 5 is a diagram of a surface pressure time history, according to embodiments of the invention. A load event or cycle may be divided into time periods 501-506, which comprise a time history. Length×500, in μm or nm, for example, may be the distance that a load travels over a component. As a load moves across a component 507, the load may exert different amounts of pressure across the component 507, depending on the weight or force of the load and the geometry of the component, for example. As shown in FIG. 5, the component may have one or more irregularities on its surface, which may result in pressure deviations in excess of the nominal pressure 508. The surface pressure may account for surface traction and bulk load applied to the component, or other forces from microscale asperity contact. Time history may, for example, be described in terms of discrete time operations or steps 501-506, wherein the microstructure stress response to each step or operation may be solved independently from one another (e.g., in parallel) under the assumption of quasi-static state of stress with application of the finite element method.

Figure 6:
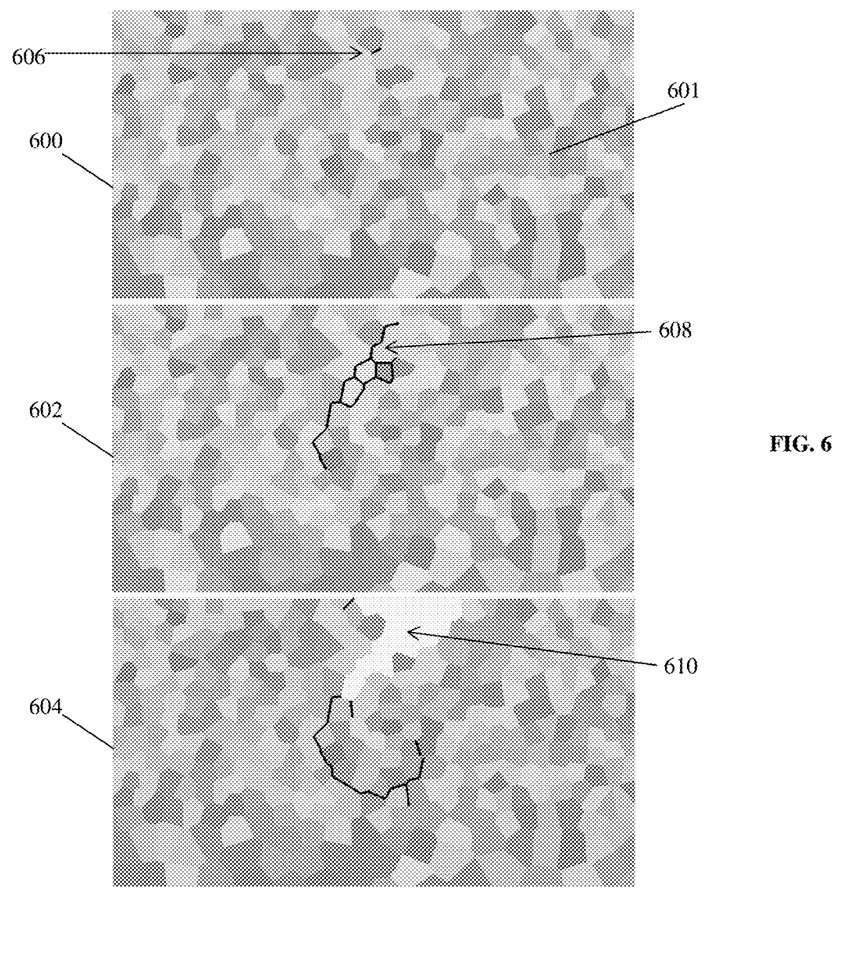
FIG. 6 is an illustration of increasing surface contact fatigue, according to embodiments of the invention.

FIG. 6 is an illustration of increasing surface contact fatigue, according to embodiments of the invention. As a component 601 (shown in cutaway, without the component's overall shape) enters several load cycles or events, the component's grain structure 601 may show increasing microcracks in the grain boundaries. A random microstructure instance may represent the increasing damage by modifying or updating the data structure describing the grain structure under stress. At state 600, a component 601 may initially have defects or cracks 606 in its microstructure, or the defect may appear after one or more load cycles. At state 602, more defects and cracks may begin to appear. A network of cracks 608 may begin to form. After further load events, the network of cracks 608 may increase in severity and result in spalling or surface cracking 610 of the component. A damage threshold may be set for example according to whether the component exhibits spalling or chipping at the surface. For example, a damage model may indicate when a number of grains are removed from the surface. A damage threshold may be when ten, twenty, or thirty grains are removed from the surface, for example, depending on the type of component that is modeled.

According to embodiments of the invention, surface pressure time history may be determined by one or more loading parameters including, for example, lubricant properties or the effect or contribution of lubrication on loads applied to a component (e.g., power transmission component). Lubrication properties may include or represent the lubrication regime (e.g., hydrodynamic, elastohydrodynamic (EHL), mixed-elastohydrodynamic, boundary, or other lubrication regime) at the time of loading of component. In a hydrodynamic lubrication regime, for example, the pressure generated in the fluid film (e.g., lubricant film) by traditional hydrodynamic action may support the applied load, allowing the surfaces (e.g., component surface and the surface of other material contacting component) to be completely separated by a film of lubricant. In an elastohydrodynamic (EHL) lubrication regime the surfaces (e.g., component surface and the surface of other material) may be separated by lubricant; however, the lubrication film thickness may be thinner or less than in hydrodynamic lubrication regime. As a result of the thinner film thickness, elastic deformation, piezoviscous effects, and other loads and effects may be applied to material specimen. In a mixed elastohydrodynamic lubrication regime the hydrodynamic action (e.g., in lubricant film) may not be sufficient to fully support the applied load. As a result, a portion of the load may, for example, be applied by direct contact of surfaces (e.g., the component surface and the surface of another material contacting the component) and/or surface asperities. A boundary lubrication regime may, for example, represent the absence of hydrodynamic lubrication, or the absence of lubrication entirely, and the applied load in a boundary lubrication regime may be completely supported by contacting surface asperities.

Figure 7A:
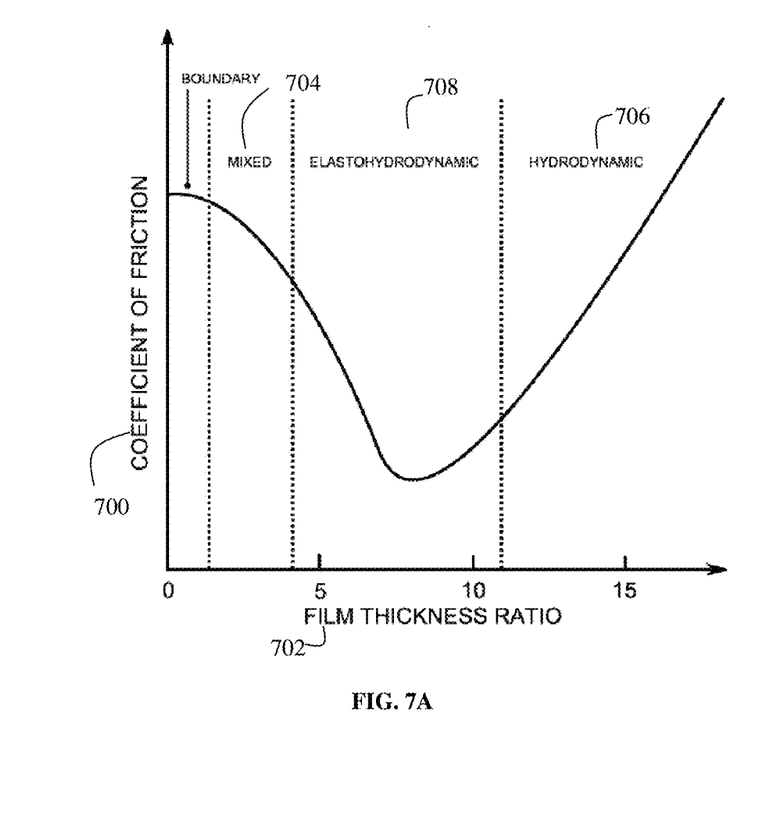
FIG. 7A is a graph illustrating different lubrication regimes, according to embodiments of the invention.

FIG. 7A is a graph illustrating different lubrication regimes. As shown, the coefficient of friction 700 of a lubricant depends on the film thickness ratio 702 of the lubricant on a component. Film thickness ratio may be a as minimum film thickness divided by composite surface roughness. In a mixed 704 and hydrodynamic 706 state, the coefficient of friction 700 may predictably vary according to the film thickness ratio 702. However, in the elastohydrodynamic state 708, the coefficient of friction 700 may vary widely and thus may be difficult to predict. The discretization of equations governing the EHL state may be preferable, using a numerical generation of surface roughness, which may be characterized by statistical uncertainty. According to some embodiments, surface roughness profile may, for example, be determined by experimental measurement, based on experimental measurement, or may be based on other information. Surface roughness profile may, for example, be a statistically or numerically generated roughness profile, which may, for example, be based on or representative of the surface roughness of a component (e.g., power transmission component, material specimen, etc.). Surface roughness profile may, for example, include or represent the presence and/or magnitude of asperities in a component. Surface roughness may be characterized by statistical parameters, such as the arithmetic mean of the surface, Ra (Eq. 6), or the root mean square Rq (Eq. 7):

$$R_a = \frac{1}{N_z} \sum_{i=1}^{N_z} |z_i| \qquad \text{Eq. 6}$$

-continued $$R_q = \left(\frac{1}{N_z}\sum_{i=1}^{N_z} z_i^2\right)^{1/2} \quad \text{Eq. 7}$$

Rq may be more sensitive to peaks and valleys on a surface, whereas Ra may average them into the reading. Surface roughness may also be characterized by skewness, or the third moment of a surface distribution. Skewness may be a measure of the distance between the mean and mode, the asymmetry, of a distribution. A positively skewed surface may consist of many peaks. In the case of a bearing the skewness may act to penetrate through the lubricant film. A well-functioning bearing surface may have a negatively skewed surface. The fourth moment, kurtosis, Rku, may be a measure of the 'peakedness' of a distribution.

$$R_{sk} = \frac{1}{N_z R_q^3}\sum_{i=1}^{N_z} z_i^3 \quad \text{Eq. 8}$$

$$R_{ku} = \frac{1}{N_z R_q^4}\sum_{i=1}^{N_z} z_i^4 \quad \text{Eq. 9}$$

Taken together, Rq, Rsk, and Rku may describe the probability distribution function of simple, randomly distributed roughness profiles. Other statistical parameters may be used.

In some embodiments, to model an EHL state, the flow of lubricant in a Hertzian contact such the gear tooth contact may be governed by the Reynolds equation:

$$\frac{\partial}{\partial X}\left(\frac{\overline{\rho}H^3}{12\overline{\eta}}\frac{\partial P}{\partial X}\right) + \frac{\partial}{\partial Y}\left(\frac{\overline{\rho}H^3}{12\overline{\eta}}\frac{\partial P}{\partial Y}\right) = \lambda\frac{\partial(\overline{\rho}H)}{\partial X} + \sigma\frac{\partial(\overline{\rho}H)}{\partial \theta} \quad \text{Eq. 10}$$

The separation between the surfaces H (the 'film thickness') may include a contribution from the mating surface curvatures, and a contribution from the elastic deformation that is a result of the pressure buildup in the lubricant. The first term on the right hand side of Eq. 10 (sometimes called the 'wedge' term) may define the influence of the converging/diverging geometry of the mating surfaces. A converging geometry may result in pressure build up in the lubricant film. In the diverging region, the pressure in the lubricant may drop until either vaporous or gaseous cavitation occurs.

In a typical point (or elliptical) EHL analysis, the film thickness may be defined as follows:

$$H_t(X, Y, \theta) = H_c(\theta) + \frac{X^2}{2} + \frac{\kappa^2 Y^2}{2r} + \delta_{1,2}(X, Y, \theta) + \frac{2c}{\pi^2}\int\int_\Omega \frac{P_t(X', Y', \theta')dX'dY'}{\sqrt{(X-X')^2 + (Y-Y')^2}} \quad \text{Eq. 11}$$

$$H_s(X, Y, \theta) = \frac{2c}{\pi^2}\frac{2c}{\pi^2}\int\int_{\Omega_s} \frac{P_s(X', Y', \theta')dX'dY'}{\sqrt{(X-X')^2 + (Y-Y')^2}} \quad \text{Eq. 12}$$

where $H_t(X, Y, \theta)$ may consists of the relative approach of the two surfaces, the undeformed shape of the contacting bodies, roughness heights for each surface, and elastic deformation due to lubricant pressure. $H_s(X, Y, \theta)$ is the elastic deformation due to solid contact pressure. Therefore, the overall film thickness is the sum of both contributions:

$$H(X,Y,\theta) = H_t(X,Y,\theta) + H_s(X,Y,\theta) \quad \text{Eq. 13}$$

The pressure over a rectangular element of a component may be approximated as constant. In discretized form, the elastic deformation over the domain may be calculated by:

$$\delta_{i,j} = \frac{2c}{\pi^2}\sum_{k=1}^{NX}\sum_{l=1}^{NY} K_{ikjl}P_{kl} \quad \text{Eq. 14}$$

where:

$$\delta_{i,j} = x_p\ln\left[\frac{y_p + \sqrt{x_p^2 + y_p^2}}{y_m + \sqrt{x_p^2 + y_m^2}}\right] + y_m\ln\left[\frac{x_m + \sqrt{x_m^2 + y_m^2}}{x_p + \sqrt{x_p^2 + y_m^2}}\right] + \quad \text{Eq. 15}$$
$$x_m\ln\left[\frac{y_m + \sqrt{x_m^2 + y_m^2}}{y_p + \sqrt{x_m^2 + y_p^2}}\right] + y_p\ln\left[\frac{x_p + \sqrt{x_p^2 + y_p^2}}{x_m + \sqrt{x_m^2 + y_p^2}}\right]$$

$$x_p = |x_i - x_k| + \frac{\Delta x}{2} \quad x_m = |x_i - x_k| + \frac{\Delta x}{2} \quad \text{Eq. 16}$$
$$y_p = |y_j - y_l| + \frac{\Delta y}{2} \quad y_m = |x_j - x_l| + \frac{\Delta y}{2}$$

While Eq. 14 may be computed using a brute force double summation, Eq. 14 may be more easily calculated by recognizing that it may be the discrete convolution of the pressure and flexibility matrix, e.g., $$\delta_{i,j} = \frac{2c}{\pi^2}P(X, Y) * K(X, Y) \quad \text{Eq. 17}$$

Following the convolution theorem, the convolution in the time (or space) domain may be equivalent to a simple multiplication in the frequency domain. Thus, if P(X, Y) has the Fourier transform $\hat{P}(f_x, f_y)$ and K(X, Y) has the Fourier transform $\hat{K}(f_x, f_y)$, then P(X, Y)*K(X, Y) has the Fourier transform $\hat{P}(f_x, f_y)\hat{K}(f_x, f_y)$. Therefore, the convolution may be calculated in the frequency domain as a simple multiplication, where the deformation may be obtained from the inverse Fourier transform.

Figure 7B:
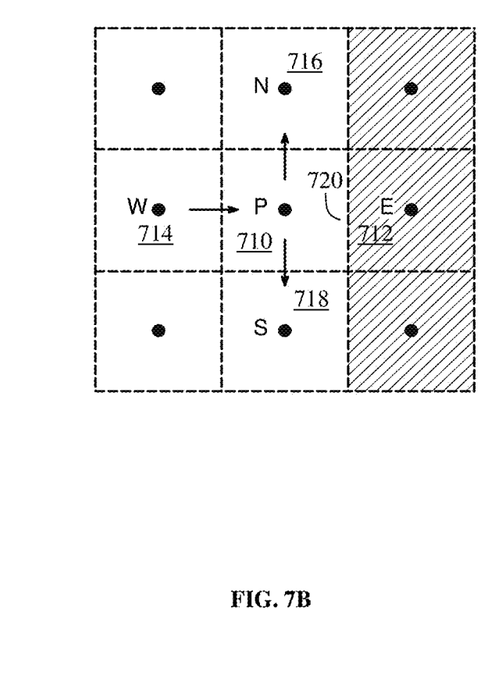
FIG. 7B is a graph illustrating the flow of lubricant between solid and lubricated regions, according to embodiments of the invention.

FIG. 7B is a graph illustrating the flow of lubricant between solid and lubricated regions, according to an embodiment of the invention. A control P region 710 may be in lubricated contact and an E region 712 may be in solid contact. To ensure mass conservation, fluid flowing into P region 710 from W region 714 may be balanced by fluid flow through the remaining open regions N 716 and S 718. The flow rate through the boundary between regions P 710 and E 712 may be zero, and may be used to derive a Nuemann type boundary condition for pressure on the east face 720. The flow rate for a Newtonian, isothermal fluid is given by $$q'_x|_e = \left[\frac{-h^3}{12\eta}\frac{\partial p}{\partial x} + \frac{u_a + u_b}{2}h\right]_e = 0 \quad \text{Eq. 18}$$

Eq. 18 may describe the pressure gradient that must exist at the east cell face 720 under the assumption of zero mass flow through this boundary. Solving for the pressure gradient may yield the boundary condition that is applied at the fluid/solid interface:

$$\left.\frac{\partial P}{\partial X}\right|_e = (\lambda_1 + \lambda_2)\left(\frac{6\bar{\eta}}{H^2}\right) \quad \text{Eq. 19}$$

The Reynolds equation may then be integrated over a control volume. Discretization of the integrated equation may yield:

$$a_e(P_E - P_P) - a_w(P_P - P_W) + a_n(P_N - P_P) - a_s(P_P - P_S) = \quad \text{Eq. 20}$$
$$\lambda\frac{(\bar{\rho}H)_P - (\bar{\rho}H)_W}{\Delta X} + \sigma\frac{(\bar{\rho}H)_P - (\bar{\rho}H)_{\bar{P}}}{\Delta\theta}$$

where the face coefficients (a) are defined as:

$$a_e = \left(\frac{\bar{\rho}H^3}{12\bar{\eta}}\right)_e \frac{1}{\Delta X^2} \quad a_w = \left(\frac{\bar{\rho}H^3}{12\bar{\eta}}\right)_w \frac{1}{\Delta X^2} \quad \text{Eq. 21}$$
$$a_n = \left(\frac{\bar{\rho}H^3}{12\bar{\eta}}\right)_n \frac{1}{\kappa^2\Delta Y^2} \quad a_s = \left(\frac{\bar{\rho}H^3}{12\bar{\eta}}\right)_n \frac{1}{\kappa^2\Delta Y^2}$$

The discretized equation may be modified to include the internal flow disruption boundary condition. For example, flow through the control region P 710 may be described by:

$$-a_w(P_P - P_W) + a_n(P_N - P_P) - a_s(P_P - P_S) = \quad \text{Eq. 22}$$
$$\lambda\frac{(\bar{\rho}H)_P - (\bar{\rho}H)_W}{\Delta X} + \sigma\frac{(\bar{\rho}H)_P - (\bar{\rho}H)_{\bar{P}}}{\Delta\theta} + B_s$$

where the source term Bs my be used to account for the zero flow boundary condition on the east control face 720:

$$B_s = \frac{(\bar{\rho}H)\lambda}{2\Delta X} \quad \text{Eq. 23}$$

The solid contact solver for region E 712 may be based on the minimization of complimentary energy approach coupled with a Fast Fourier Transform (FFT). From Eq. 13, the overall film thickness H is a superposition of the elastic deformation due to solid contact (Hs), the elastic deformation due to lubricant pressure, and the undeformed geometry. The latter two contributions may be the initial gap/overlap, Hl, for the case of a pure solid contact. The normal displacement Hs must be equivalent to the resulting overlap of the surfaces. Hence, minimization of the dimensionless complimentary energy may be expressed as:

$$\min f(P) = \frac{1}{2}\int\int_{\Omega_s} PH_s dXdY + \int\int_{\Omega_s} PH_l dXdY \quad \text{Eq. 24}$$

The solution procedure for solid contact pressure may be as follows:

$$P_s^{new} = P_s^{old} - \bar{\omega}_s \nabla f(P_s) \quad \text{Eq. 25}$$

Since f(Ps) is known to be quadratic, the gradient can be written as:

$$\nabla f(P_s) = H_s + H_l \quad \text{Eq. 26}$$

Thus pressure gradient P may be characterized by:

$$P^{new} = P^{old} - \omega(H_s^{old} + H_l) \quad \text{Eq. 27}$$

under the condition that within the contact:

$$|H_s + H_l|_{max} < \varepsilon \quad \text{Eq. 28}$$

Figure 8:
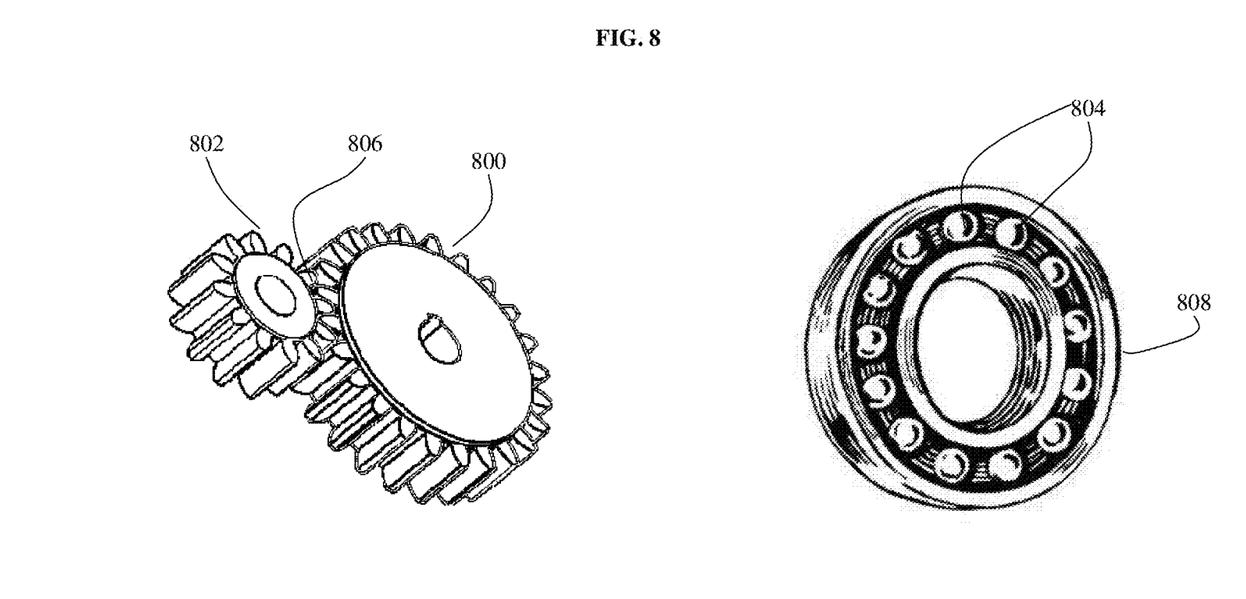
FIG. 8 is a depiction of sample mechanical components according to embodiments of the invention.

FIG. 8 is a depiction of sample mechanical components according to an embodiment of the invention. Components 800, 802, 804 may be made of, for example, steel (e.g., polycrystalline high strength steel other steel), composites, and/or other metals based. Components 800, 802, and 804 may be modeled by a finite element model that describes the grain structure of the components' material or composition. Components such as gears 800, 802 may be modeled. Surface fatigue life may be determined on the contact area 806 of each of the gears 800, 802, or both. A load event for the gears 800, 802 may be a full rotation of one of the gears, a meshing cycle, or other discrete amount of time. Components such as ball bearings 804 may also be modeled. A load event for the ball bearings 804 may be a revolution of a ball bearing machine 808 or other time period. Embodiments of the invention may predict the surface fatigue life from the contact area between the ball bearings 804 and the ball bearing machine 808, for example. Other power transmission components in a variety of shapes and configurations may be used.

Figure 9:
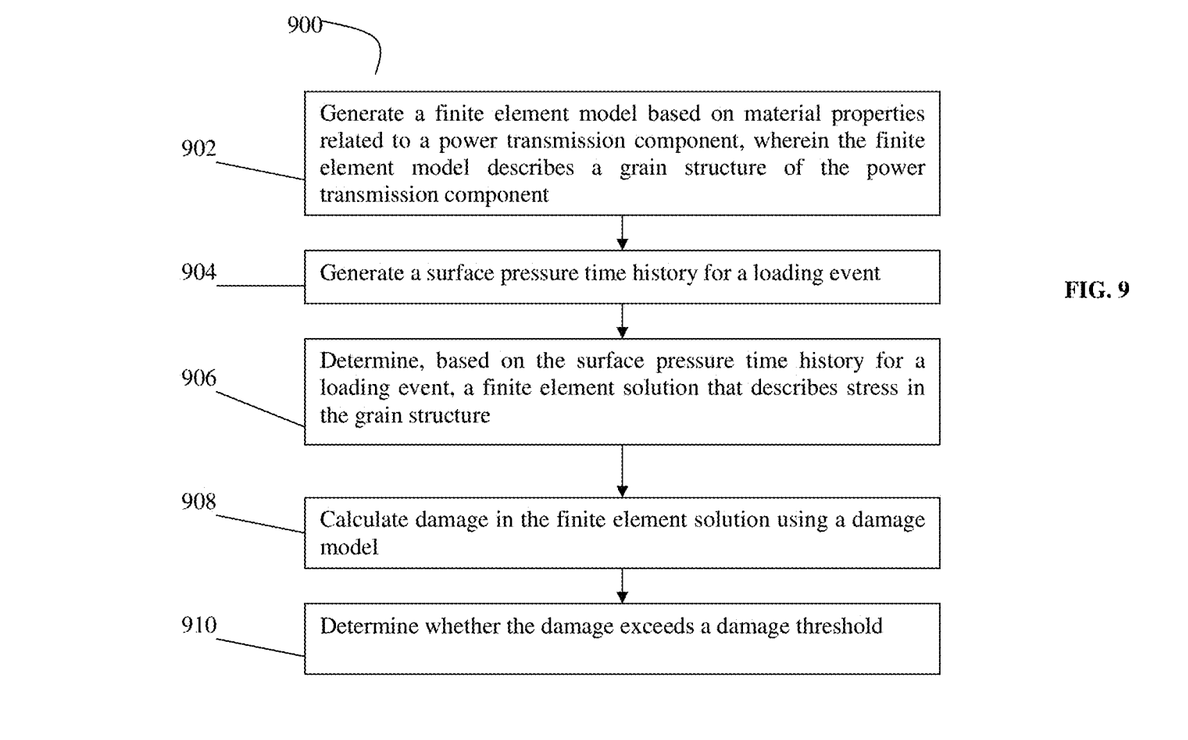
FIG. 9 is a flowchart of a method of determining surface contact fatigue, according to embodiments of the invention.

FIG. 9 is a flowchart of a method 900 of determining surface contact fatigue, according to embodiments of the invention. In operation 902, a finite element model may be generated based on material properties related to a power transmission or machine component. The finite element model may be a random microstructure instance which describes a grain structure and grain boundaries of the power transmission component. In operation 904, a surface pressure time history may be generated for a loading event or loading cycle. The surface pressure time history may be generated or determined based on a surface roughness profile, lubricant properties, and transmitted load of the component. In operation 906, a finite element solution may be determined that describes stress in the grain structure, based on the surface pressure time history for a loading event. In operation 906, a damage model may be used to calculate damage in the finite element solution. The damage may be calculated or determined by the accumulated stress or load in each grain boundary in the grain structure. In operation 910, it may be determined whether the damage exceeds or meets a damage threshold. If it is determined that a damage threshold has been met or exceeded, a number of loading cycles that occurred before meeting the damage threshold, may be output to, for example, a display or memory. If it is determined that a damage threshold has not been met or exceeded, the processor may repeat, for example, operations 904-908, until a damage threshold is met.

Embodiments of the present invention may include apparatuses for performing the operations described herein. Such apparatuses may be specially constructed for the desired purposes, or may comprise computers or processors selectively activated or reconfigured by a computer program stored in the computers. Such computer programs may be stored in a computer-readable or processor-readable non-transitory storage medium, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions. It will be appreciated that a variety of programming languages may be used to implement the teachings of the invention as described herein. Embodiments of the invention may include an article such as a non-transitory computer or processor readable non-transitory storage medium, such as for example a memory, a disk drive, or a USB flash memory encoding, including or storing instructions, e.g., computer-executable instructions, which when executed by a processor or controller, cause the processor or controller to carry out methods disclosed herein. The instructions may cause the processor or controller to execute processes that carry out methods disclosed herein.

Different embodiments are disclosed herein. Features of certain embodiments may be combined with features of other embodiments; thus, certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

What is claimed is:

1. A method of predicting surface contact fatigue life of a bearing in a wind turbine generating electricity, comprising:
    configuring a computer-based system to predict surface contact fatigue life of the bearing, the computer-based system comprising:
        an input device configured to receive material properties relating to the bearing;
        an output device configured to convey information relating to the bearing;
        memory storing the material properties relating to the bearing and computer-executable instructions to process the material properties relating to the bearing; and
        a processor; and
    predicting the surface contact fatigue life of the bearing with the computer-based system according to processes of the computer-executable instructions;
    wherein the computer-executable instructions cause the processor to predict the surface contact fatigue life of the bearing by:
        generating a finite element model based on the material properties related to the bearing, wherein the finite element model describes a grain structure of the bearing and represents polycrystalline properties of the bearing, and wherein generating the finite element model comprises generating a random microstructure instance using a tessellation and meshing the random microstructure instance with a convex polygon;
        generating a surface pressure time history for a simulated loading event on the finite element model, wherein the simulated loading event represents one revolution of the wind turbine and the simulated loading event is divided into discrete time steps, and using the finite element model, a defined load is simulated to travel a distance over the bearing in each time step and simulated to exert different amounts of pressure across the bearing in each time step due to asperity contact, wherein the surface pressure time history is based on a surface roughness, and wherein the surface roughness is numerically generated and characterized by statistical parameters;
        determining based on the surface pressure time history for a loading event, a finite element solution that describes stress in the grain structure;
        calculating damage in the finite element solution using a damage model, the damage model including the stress in the grain structure;
        determining whether the damage exceeds a damage threshold;
        if damage does not exceed a threshold, repeating at least the generating a surface pressure time history, determining a finite element solution, and calculating damage operations; and
        if damage does exceed a threshold, outputting via the output device the number of load cycles required for failure of the bearing.

2. The method according to claim 1, wherein generating a surface pressure time history comprises generating a surface traction time history and a bulk loading time history.

3. The method according to claim 1, wherein generating a surface pressure time history is based on one or more parameters related to the geometry and physical properties of the bearing.

4. The method according to claim 3, wherein the one or more loading parameters comprises a surface roughness profile, lubricant properties, and transmitted load.

5. The method according to claim 1, comprising updating the finite element model based on the calculated damage.

6. The method according to claim 1, wherein the material properties related to the bearing comprise parameters related to microstructure geometry and physical composition of the bearing, and the random microstructure instance comprises a random distribution of nucleation points.

7. The method according to claim 1, wherein the random microstructure instance comprises grain boundaries surrounding regions of steady thermodynamic phase change.

8. A method of predicting surface contact fatigue life of a bearing in a wind turbine, comprising:
    configuring a computer-based system to predict surface contact fatigue life, the computer-based system comprising:
        an input device configured to receive material properties relating to the bearing;
        an output device configured to convey information relating to the bearing;
        memory storing the material properties relating to the bearing and computer-executable instructions to process the material properties relating to the bearing; and
        a processor; and
    predicting the surface contact fatigue life of the bearing with the computer-based system according to processes of the computer-executable instructions;
    wherein the computer-executable instructions cause the processor to predict the surface contact fatigue life of the bearing by:
        generating a finite element model that models a structure of the bearing, wherein generating the finite element model comprises generating, using a tessellation, a random microstructure instance comprising nucleation points and grain boundaries, wherein the finite element model represents polycrystalline properties of the bearing;

determining, based on a surface pressure time history for a simulated loading event, a finite element solution describing stress in the structure wherein the simulated loading event is divided into discrete time steps, and using the finite element model, a defined load is simulated to travel a distance over the bearing in each time step and simulated to exert different amounts of pressure across the bearing in each time step due to asperity contact, wherein the surface pressure history is based on a surface roughness, and wherein the surface roughness is numerically generated and characterized by statistical parameters, wherein the simulated loading event represents one revolution of the wind turbine;

calculating a damage level in the finite element solution determined by the stress in the structure;

determining whether the calculated damage exceeds a failure threshold for the bearing;

determining the number of loading events required for bearing failure; and outputting the number of loading events required for bearing failure using the output device.

9. The method of claim 8, wherein generating the finite element model comprises generating the random microstructure instance using a Voronoi tessellation and meshing the random microstructure instance with a convex polygon.

10. The method of claim 8, wherein the surface pressure history is based on a surface roughness profile, lubricant properties, and transmitted load of the component.

11. A method for modeling stresses and predicting surface contact fatigue life of a power transmission component in a power transmission, comprising:

obtaining material properties related to a power transmission component;

generating a finite element model based on the material properties related to the power transmission component, wherein the finite element model describes a grain structure of the bearing and represents polycrystalline properties of the power transmission component;

generating loading parameters, wherein the loading parameters characterize a surface roughness;

simulating a loading event onto the finite element model, wherein the loading event represents one revolution of the power transmission and is divided into discrete time steps, and using the finite element model, a defined load is simulated to travel a distance over the power transmission component in each time step, wherein the defined load is simulated to exert different amounts of pressure across the power transmission component in each time step due to asperity contact;

generating a surface pressure time history for the loading event on the finite element model, wherein the surface pressure time history is based on the loading parameters;

determining, based on the surface pressure time history for the loading event, a finite element solution that describes stress in the grain structure;

calculating damage in the finite element solution using a damage model, the damage model including the stress in the grain structure; and determining whether the damage exceeds a damage threshold.

12. The method of claim 11, further comprising obtaining material specimen information relating to the power transmission component.

13. The method of claim 12, wherein generating a finite element model is further based on the material specimen information related to the power transmission component.

14. The method of claim 13, wherein generating a finite element model is accomplished by generating a random microstructure instance of the power transmission component.

15. The method of claim 14, wherein the random microstructure instance serves as the finite element model.

* * * * *